US012700845B2

(12) United States Patent
Inoue et al.

(10) Patent No.: US 12,700,845 B2
(45) Date of Patent: Aug. 4, 2026

(54) ACOUSTIC WAVE DEVICE

(71) Applicant: Murata Manufacturing Co., Ltd.,
Nagaokakyo (JP)

(72) Inventors: Kazunori Inoue, Nagaokakyo (JP);
Shintaro Kubo, Nagaokakyo (JP)

(73) Assignee: **MURATA MANUFACTURING CO.,
LTD.**, Kyoto (JP)

(*) Notice: Subject to any disclaimer, the term of this
patent is extended or adjusted under 35
U.S.C. 154(b) by 719 days.

(21) Appl. No.: 18/143,234

(22) Filed: May 4, 2023

(65) Prior Publication Data

US 2023/0275554 A1 Aug. 31, 2023

Related U.S. Application Data

(63) Continuation of application No.
PCT/JP2021/039764, filed on Oct. 28, 2021.

(60) Provisional application No. 63/176,578, filed on Apr.
19, 2021, provisional application No. 63/112,243,
filed on Nov. 11, 2020.

(51) Int. Cl.
H03H 9/02 (2006.01)
H03H 3/02 (2006.01)

(52) U.S. Cl.
CPC .......... H03H 9/02015 (2013.01); H03H 3/02
(2013.01); H03H 9/02228 (2013.01)

(58) Field of Classification Search
CPC .......... H03H 9/02015; H03H 9/02228; H03H
9/02535; H03H 9/02102; H03H 9/173;
H10N 30/30; H10N 30/87; H10N 30/853
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 9,590,587 | B1 * | 3/2017 | Thalmayr | .............. H03H 9/059 |
| 10,491,192 | B1 | 11/2019 | Plesski et al. | |
| 2010/0052472 | A1 | 3/2010 | Nishino et al. | |
| 2010/0064492 | A1 * | 3/2010 | Tanaka | .............. H03H 9/02023 |
| | | | | 29/25.35 |
| 2012/0161003 | A1 | 6/2012 | Tsuchiya | |
| 2014/0018126 | A1 | 1/2014 | Asai et al. | |
| 2014/0152145 | A1 | 6/2014 | Kando et al. | |

(Continued)

FOREIGN PATENT DOCUMENTS

| | | |
|---|---|---|
| CN | 209709146 U | 11/2019 |
| JP | 2008098974 A | 4/2008 |
| JP | 2010056736 A | 3/2010 |

(Continued)

OTHER PUBLICATIONS

International Search Report in PCT/JP2021/039764, mailed Dec.
28, 2021, 4 pages.

(Continued)

*Primary Examiner* — Derek J Rosenau
(74) *Attorney, Agent, or Firm* — Keating & Bennett, LLP

(57) ABSTRACT

An acoustic wave device includes a support including a
support substrate, a piezoelectric layer on the support, and
an IDT electrode on a first main surface of the piezoelectric
layer, wherein the support includes an air gap portion opened
on a piezoelectric layer side, the support includes an inner
side wall facing the air gap portion, and a high thermal
conductive film is directly or indirectly laminated on at least
a portion of a second main surface of the piezoelectric layer
and extends to the inner side wall of the support.

21 Claims, 14 Drawing Sheets

(56)    References Cited

U.S. PATENT DOCUMENTS

| | | | |
|---|---|---|---|
| 2017/0250671 A1* | 8/2017 | Omura | H03H 9/02228 |
| 2022/0069803 A1 | 3/2022 | Nozoe | |

FOREIGN PATENT DOCUMENTS

| | | |
|---|---|---|
| JP | 2010220204 A | 9/2010 |
| JP | 2011018675 A | 1/2011 |
| JP | 2012137366 A | 7/2012 |
| WO | 2012073871 A1 | 6/2012 |
| WO | 2020130128 A1 | 6/2020 |

OTHER PUBLICATIONS

Written Opinion in PCT/JP2021/039764, mailed Dec. 28, 2021, 5 pages.

Official Communication issued in corresponding Chinese Patent Application No. 202180075645.X, mailed on Apr. 30, 2026, 8 pages.

\* cited by examiner

ACOUSTIC WAVE DEVICE

CROSS REFERENCE TO RELATED APPLICATIONS

This application claims the benefit of priority to Provisional Application No. 63/112,243 filed on Nov. 11, 2020 and Provisional Application No. 63/176,578 filed on Apr. 19, 2021, and is a Continuation Application of PCT Application No. PCT/JP2021/039764 filed on Oct. 28, 2021. The entire contents of each application are hereby incorporated herein by reference.

BACKGROUND OF THE INVENTION

1. Field of the Invention

The present invention relates to an acoustic wave device that includes a piezoelectric layer made of lithium niobate or lithium tantalate.

2. Description of the Related Art

Conventionally, an acoustic wave device that has a piezoelectric layer made of lithium niobate or lithium tantalate is known. For example, U.S. Pat. No. 10,491,192 discloses an acoustic wave device in which a piezoelectric layer made of lithium niobate or lithium tantalate is provided on a support substrate having a cavity. In this acoustic wave device, an IDT electrode is provided on an upper surface of the piezoelectric layer so as to be located above the cavity.

A conventional acoustic wave device such as the one described in U.S. Pat. No. 10,491,192 needs improvement in heat radiation performance.

SUMMARY OF THE INVENTION

Preferred embodiments of the present invention provide acoustic wave devices each having good heat radiation performance.

A preferred embodiment of the present invention provides an acoustic wave device that includes a support including a support substrate, a piezoelectric layer on the support and including first and second main surfaces that are opposed to each other, and an IDT electrode on the first main surface of the piezoelectric layer and including a plurality of electrode fingers, wherein the support includes an air gap portion open on a piezoelectric layer side, and the air gap portion overlaps at least a portion of the IDT electrode in a thickness direction of the support, the support includes an inner side wall that faces the air gap portion, a high thermal conductive film is directly or indirectly laminated on at least a portion of the second main surface of the piezoelectric layer, extends to the inner side wall of the support, and has higher thermal conductivity than the piezoelectric layer.

According to preferred embodiments of the present invention, acoustic wave devices each having good heat radiation performance are able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14 is a cross-sectional view taken along line A-A of FIG. 13A.

FIG. 15A is a schematic elevational cross-sectional view for explaining a Lamb wave propagating through a piezoelectric film of a conventional acoustic wave device, and FIG. 15B is a schematic elevational cross-sectional view for explaining vibration of an acoustic wave device that uses a thickness shear mode.

DETAILED DESCRIPTION OF THE PREFERRED EMBODIMENTS

The present invention will be made clear by describing preferred embodiments of the present invention with reference to the drawings.

Figure 1:
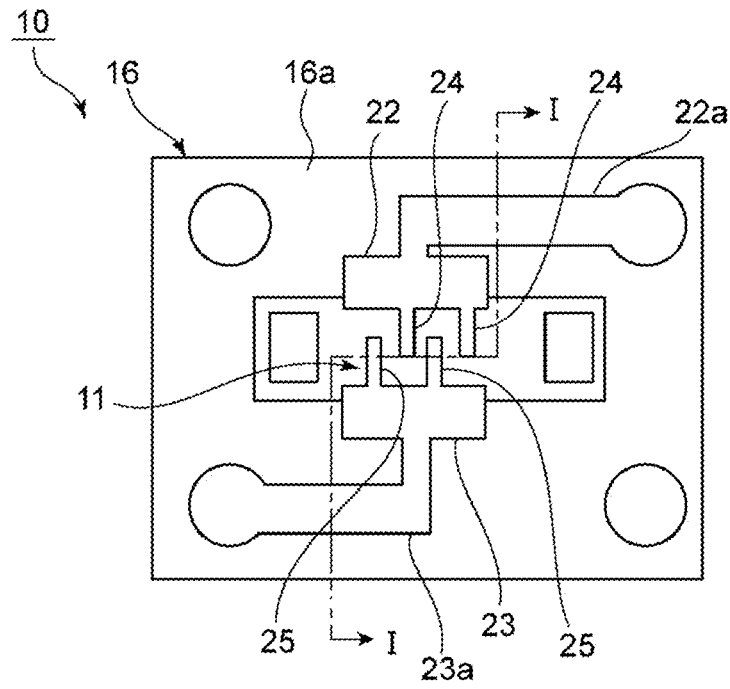
FIG. 1 is a plan view of an acoustic wave device according to a first preferred embodiment of the present invention.
Figure 2:
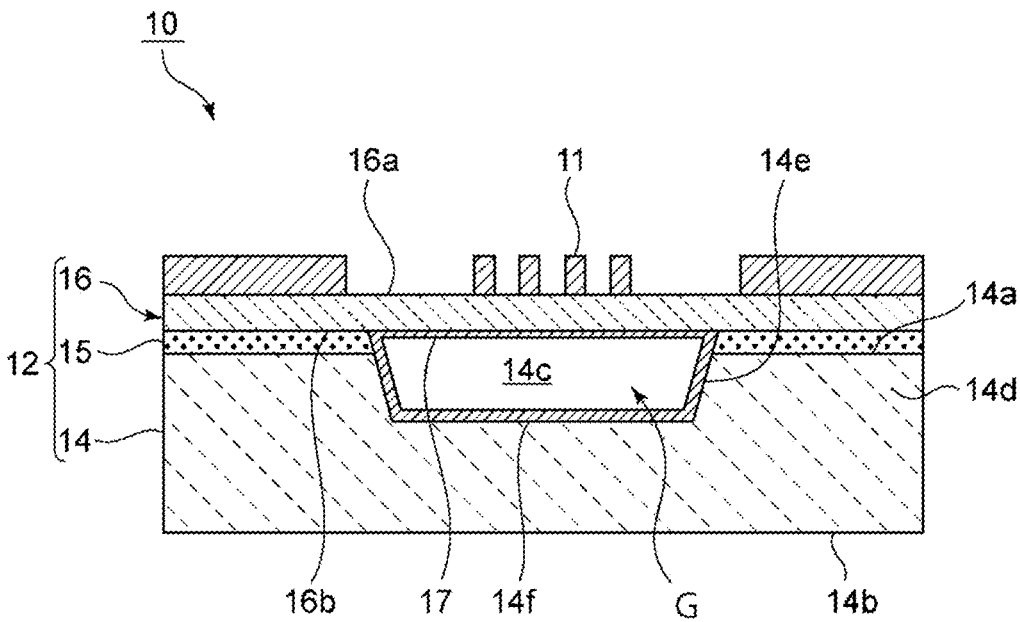
FIG. 2 is a cross-sectional view of the acoustic wave device according to the first preferred embodiment of the present invention and is a cross-sectional view taken along line I-I of FIG. 1.

FIG. 1 is a plan view of an acoustic wave device according to a first preferred embodiment of the present invention. FIG. 2 is a cross-sectional view of the acoustic wave device according to the first preferred embodiment of the present invention. Note that FIG. 2 is a cross-sectional view taken along line I-I of FIG. 1.

As illustrated in FIG. 2, an acoustic wave device 10 includes a piezoelectric substrate 12 and an IDT electrode 11 provided on the piezoelectric substrate 12. The piezoelectric substrate 12 includes a support substrate 14 defining and functioning as a support member, a dielectric layer 15, and a piezoelectric layer 16. The piezoelectric layer 16 is provided on the support substrate 14 with the dielectric layer 15 interposed therebetween.

The support substrate 14 includes a first main surface 14a and a second main surface 14b. The first main surface 14a and the second main surface 14b are opposed to each other. A recessed portion 14c is provided on the first main surface 14a. Furthermore, the support substrate 14 includes a support portion 14d. The support portion 14d is a portion that surrounds the recessed portion 14c and supports the piezoelectric layer 16 with the dielectric layer 15 interposed therebetween.

The piezoelectric layer 16 is provided on the dielectric layer 15 so as to block the recessed portion 14c. In the present preferred embodiment, the recessed portion 14c defines an air gap portion G. The air gap portion G is surrounded by the support substrate 14, the dielectric layer 15, and the piezoelectric layer 16.

The piezoelectric layer 16 includes a first main surface 16a and a second main surface 16b. The first main surface 16a and the second main surface 16b are opposed to each other. The second main surface 16b is a main surface on a support substrate 14 side.

The piezoelectric layer 16 is made of, for example, lithium niobate such as $LiNbO_3$ or lithium tantalate such as $LiTaO_3$. In the present specification, a case where a certain member is made of a certain material encompasses a case where an impurity is included in a minute amount to such an extent that electric characteristics of the acoustic wave device do not deteriorate.

As illustrated in FIG. 1, the IDT electrode 11 is provided on the first main surface 16a of the piezoelectric layer 16. The IDT electrode 11 includes a first busbar 22 and a second busbar 23, and a plurality of first electrode fingers 24 and a plurality of second electrode fingers 25. The first busbar 22 and the second busbar 23 are opposed to each other. The plurality of first electrode fingers 24 are periodically disposed. One end of each of the plurality of first electrode fingers 24 is connected to the first busbar 22. The plurality of second electrode fingers 25 are periodically disposed. One end of each of the plurality of second electrode fingers 25 is connected to the second busbar 23. The plurality of first electrode fingers 24 and the plurality of second electrode fingers 25 are interdigitated with each other. Wiring electrodes 22a and 23a are provided on the first main surface 16a. The wiring electrodes 22a and 23a are electrically connected to the IDT electrode 11.

A direction in which adjacent ones of the first and second electrode fingers 24 and 25 face each other is referred to as an electrode fingers facing direction. In the present preferred embodiment, the electrode fingers facing direction is orthogonal or substantially orthogonal to a direction in which the plurality of first electrode fingers 24 and the plurality of second electrode fingers 25 extend. Hereinafter, the first electrode fingers 24 and the second electrode fingers 25 may be referred to simply as electrode fingers.

The air gap portion G only needs to overlap at least a portion of the IDT electrode 11 in a thickness direction of the support member.

In the acoustic wave device 10, an acoustic wave is excited by applying an alternating-current voltage to the IDT electrode 11. The acoustic wave device 10 is, for example, configured to be able to use a bulk wave in a thickness shear mode. An preferable configuration of the acoustic wave device using a bulk wave in a thickness shear mode will be described later with reference to FIGS. 13A and 13B and subsequent drawings.

As illustrated in FIG. 1, in the acoustic wave device 10, the support substrate 14 includes an inner side wall 14e that faces the air gap portion G. In the air gap portion G, the support substrate 14 includes a bottom surface 14f that faces the piezoelectric layer 16. In the air gap portion G, a high thermal conductive film 17 is laminated on the second main surface 16b of the piezoelectric layer 16. The high thermal conductive film 17 is directly laminated on the second main surface 16b. However, the high thermal conductive film 17 may be indirectly laminated on the second main surface 16b.

The high thermal conductive film 17 has higher thermal conductivity than the piezoelectric layer 16. The high thermal conductive film 17 is made of a material having such high thermal conductivity. Examples of the material having high thermal conductivity include metals and insulators having higher thermal conductivity than a piezoelectric single crystal.

The high thermal conductive film 17 extends from the second main surface 16b of the piezoelectric layer 16 to the inner side wall 14e of the support substrate 14. Furthermore, in the present preferred embodiment, the high thermal conductive film 17 extends to the bottom surface 14f of the recessed portion 14c. That is, in the present preferred embodiment, the high thermal conductive film 17 surrounds the air gap portion G.

Conventionally, a structure in which a piezoelectric layer is provided above an air gap portion has a problem that it is difficult for heat generated by excitation to escape from the piezoelectric layer to an outside. More specifically, when an IDT electrode is driven, heat is generated in a region where the IDT electrode of the piezoelectric layer is provided. However, in a case where an air gap portion is present below the piezoelectric layer, it is difficult for the generated heat to escape. That is, there has been a problem that heat radiation performance is low.

On the other hand, in the acoustic wave device 10, the high thermal conductive film 17 is provided, and therefore heat generated by excitation easily escapes toward the air gap portion G through the high thermal conductive film 17. This makes it possible to effectively increase heat radiation performance.

Preferably, thermal conductivity of at least one of the support substrate 14 and the dielectric layer 15 is higher than thermal conductivity of the piezoelectric layer 16. This can further increase heat radiation performance.

The thermal conductivity of the support substrate 14 is preferably higher than the thermal conductivity of the piezoelectric layer 16. This can more effectively increase heat radiation performance.

The support member includes only the support substrate 14, but may have a structure in which another dielectric layer or semiconductor layer is laminated on the support substrate 14.

The high thermal conductive film 17 is preferably a dielectric film made of a dielectric having high thermal conductivity. As the dielectric, for example, aluminum oxide, silicon nitride, zirconia, titania, graphene, or the like is suitably used. As the dielectric, more preferably, for example, aluminum oxide, silicon oxide, silicon nitride, or silicon oxynitride is used. This can more effectively increase heat radiation performance.

The high thermal conductive film 17 may have a uniform thickness or may partially have a different thickness. As illustrated in FIG. 2, thicknesses of the high thermal conductive film 17 on the inner side wall 14e and the bottom surface 14f may be larger than a thickness of the high thermal conductive film 17 on the second main surface 16b of the piezoelectric layer 16.

An example of a method for producing the acoustic wave device 10 is described with reference to FIGS. 3A to 3D, FIGS. 4A to 4C, and FIGS. 5A and 5B.

Figure 3A:
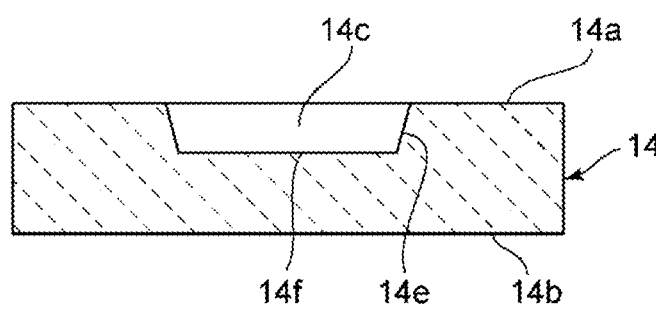
FIGS. 3A to 3D are elevational cross-sectional views for explaining an example of a method for producing the acoustic wave device according to the first preferred embodiment of the present invention.

First, as illustrated in FIG. 3A, the recessed portion 14c is formed on the support substrate 14. The recessed portion 14c can be formed by, for example, application of a resist from a first main surface 14a side, patterning, etching of the support substrate, and removal of the resist.

Figure 3B:
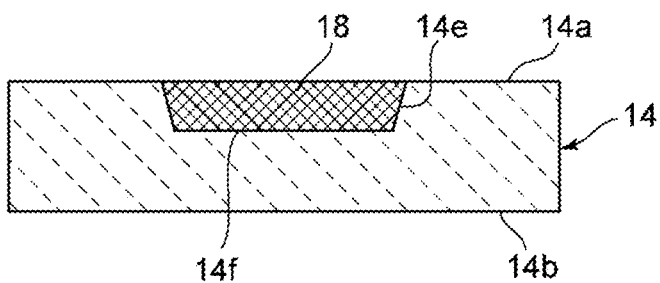

Next, as illustrated in FIG. 3B, a sacrificial layer 18 is provided in the recessed portion 14c. The sacrificial layer 18 can be formed by, for example, forming a film of the sacrificial layer 18 and flattening the film by grinding. The sacrificial layer 18 is made of a material to be removed in a step that will be described later.

Figure 3C:
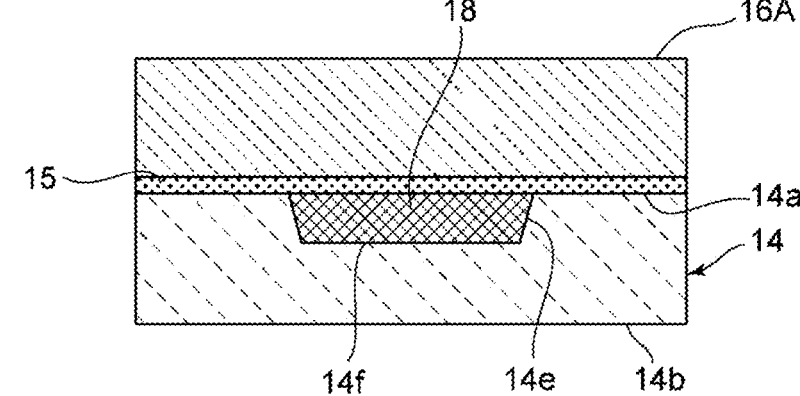

Next, as illustrated in FIG. 3C, the dielectric layer 15 is laminated. After the dielectric layer 15 is laminated, a piezoelectric substrate 16A is joined onto the dielectric layer 15.

Figure 3D:
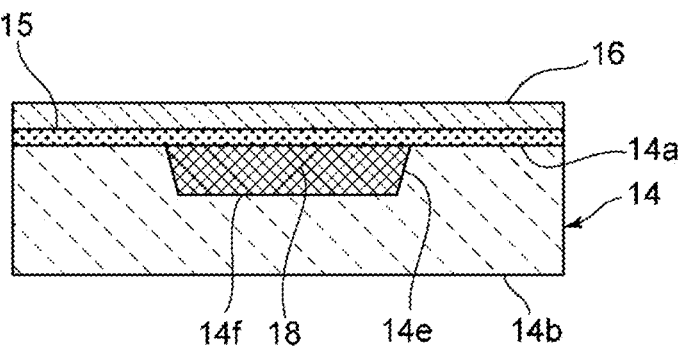

Next, the piezoelectric substrate 16A is ground. In this way, the piezoelectric layer 16 illustrated in FIG. 3D is formed.

Figure 4A:
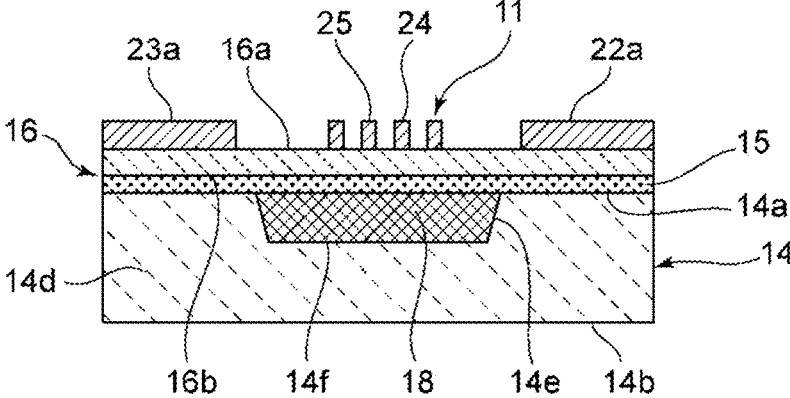
FIGS. 4A to 4C are elevational cross-sectional views for explaining an example of a method for producing the acoustic wave device according to the first preferred embodiment of the present invention.

Next, as illustrated in FIG. 4A, the IDT electrode 11 and the wiring electrodes 22a and 23a are formed by, for example, a liftoff process.

Figure 4B:
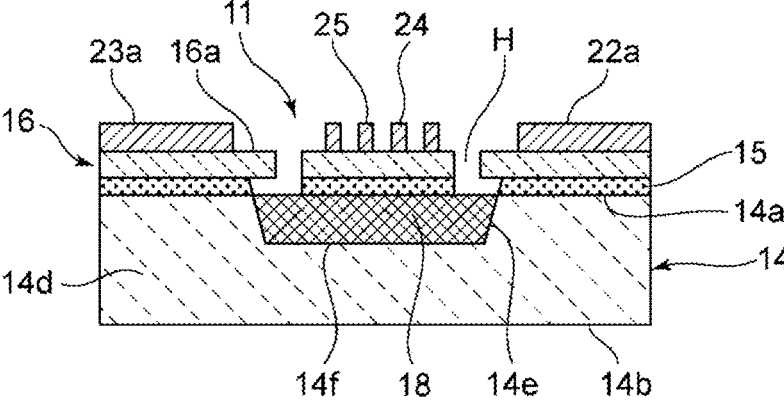

After application of a resist, patterning, and removal of the piezoelectric layer 16 and the dielectric layer 15 located in a cavity H, which will be described later, by dry etching of the piezoelectric layer 16 and the dielectric layer 15 in the cavity H, a resist layer is removed. In this way, as illustrated in FIG. 4B, the cavity H is formed in the piezoelectric layer 16 and the dielectric layer 15. The cavity H is provided to remove the sacrificial layer 18.

Figure 4C:
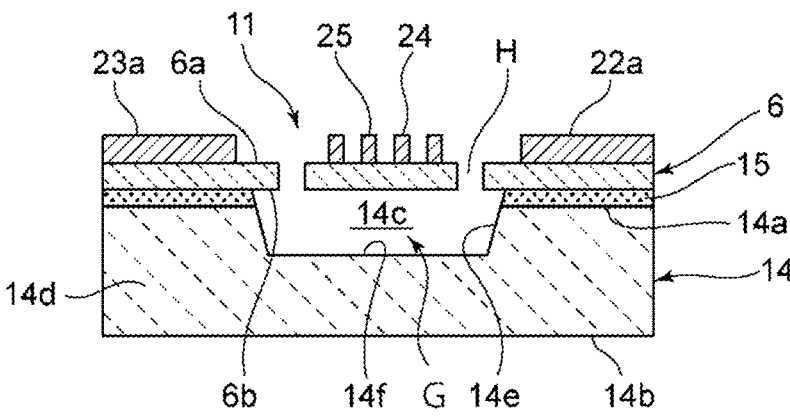

Portions other than the cavity H are protected by a resist by resist application and patterning, an etching liquid for removing the sacrificial layer 18 and the dielectric layer is injected through the cavity H to remove the sacrificial layer 18 and the dielectric layer, and then the resist is removed. In this way, as illustrated in FIG. 4C, the sacrificial layer 18 and the dielectric layer 15 are removed. In this way, the air gap portion G is provided.

Figure 5A:
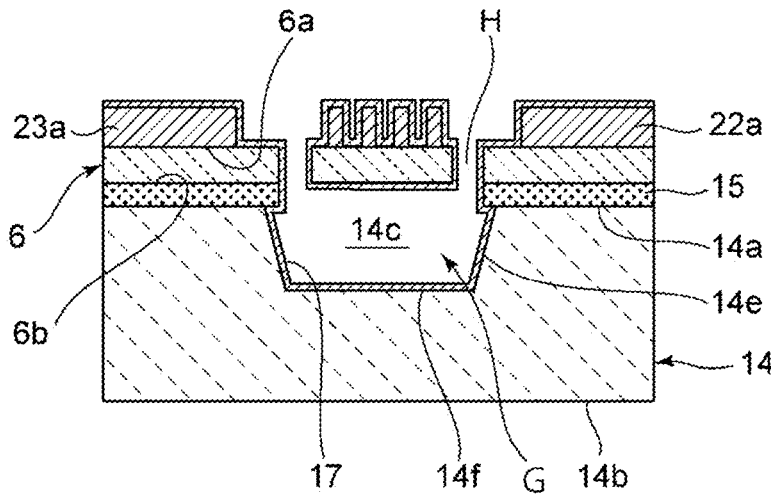
FIGS. 5A and 5B are elevational cross-sectional views for explaining an example of a method for producing the acoustic wave device according to the first preferred embodiment of the present invention.

Next, as illustrated in FIG. 5A, the high thermal conductive film 17 is formed. This film formation can be performed by a method such as, for example, atomic layer deposition (ALD) or CVD. Preferably, the ALD film formation method is used. This makes it possible to form the high thermal conductive film 17 with a highly accurate thickness.

Figure 5B:
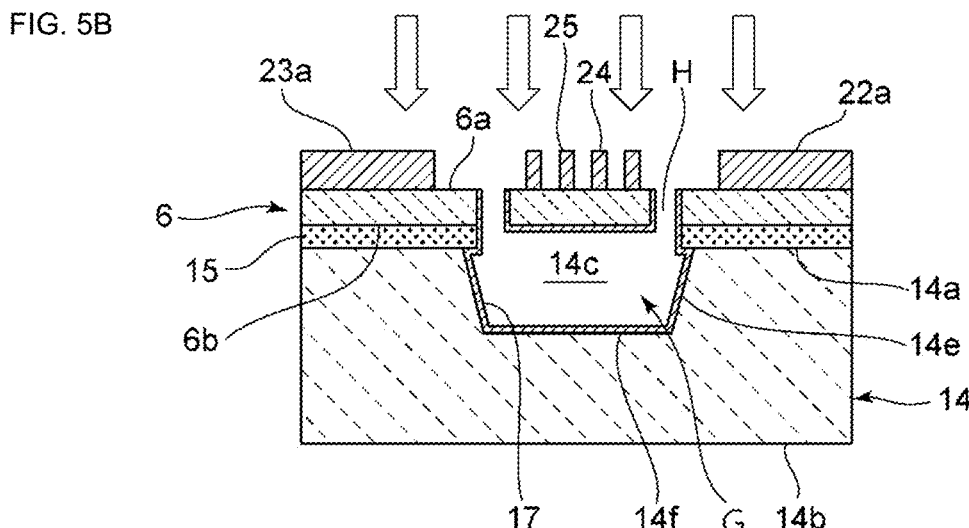

Next, as illustrated in FIG. 5B, an ALD layer (the high thermal conductive film 17) on the IDT electrode 11 and the wiring electrodes 22a and 23a is removed by ion milling. As illustrated in FIG. 5B, the high thermal conductive film 17 may remain on a side wall of the cavity H.

An ion beam such as, for example, an Ar beam can be used for the ion milling.

Another example of a method for producing the acoustic wave device 10 according to the first preferred embodiment is described with reference to FIGS. 6A to 6D and FIGS. 7A to 7C.

Figure 6A:
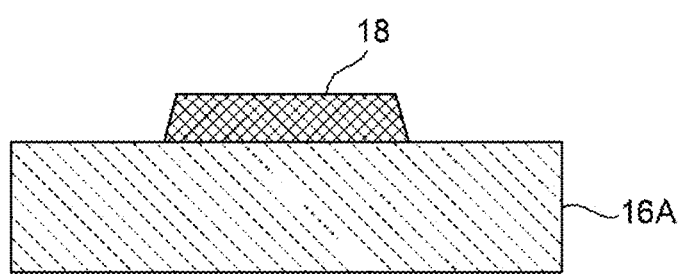
FIGS. 6A to 6D are elevational cross-sectional views for explaining another example of a method for producing the acoustic wave device according to the first preferred embodiment of the present invention.

First, as illustrated in FIG. 6A, the sacrificial layer 18 is formed on the piezoelectric substrate 16A. The sacrificial layer 18 can be formed by, for example, application of a resist, patterning, etching of the sacrificial layer 18, and removal of the resist.

Figure 6B:
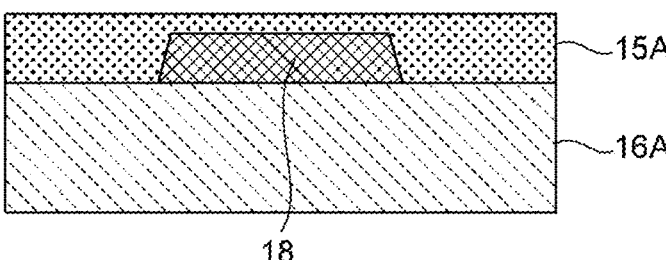

Next, as illustrated in FIG. 6B, a dielectric layer 15A defining and functioning as a joining layer made of a dielectric is formed. The dielectric layer 15A is, for example, formed by forming a film of the dielectric layer and flattening the film by grinding.

Figure 6C:
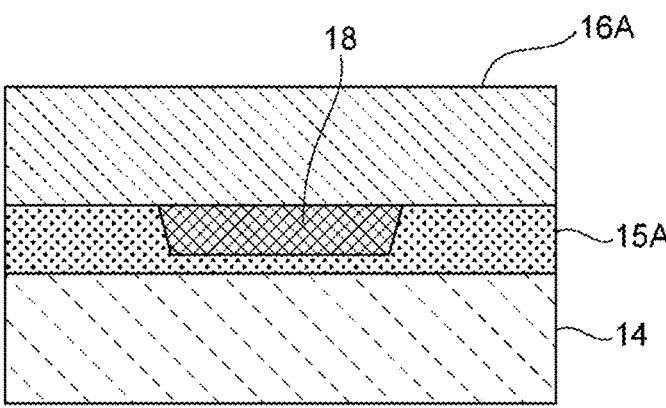

Next, as illustrated in FIG. 6C, the support substrate 14 is laminated on the dielectric layer 15A. That is, the piezoelectric substrate 16A and the support substrate 14 can be joined by using the dielectric layer 15A as a joining layer.

Figure 6D:
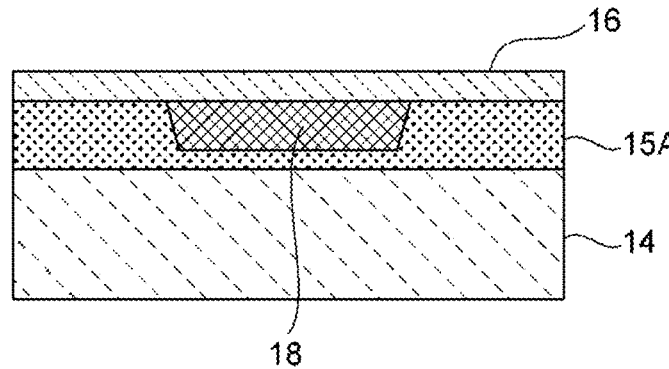

Next, as illustrated in FIG. 6D, the piezoelectric substrate 16A is thinned by grinding. In this way, the piezoelectric layer 16 is formed.

Figure 7A:
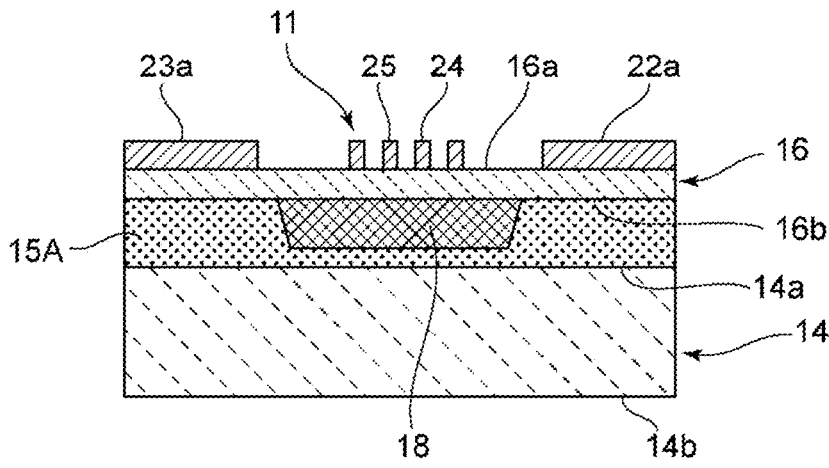
FIGS. 7A to 7C are elevational cross-sectional views for explaining another example of a method for producing the acoustic wave device according to the first preferred embodiment of the present invention.

Next, as illustrated in FIG. 7A, the IDT electrode 11 and the wiring electrodes 22a and 23a are formed. The IDT electrode 11 and the wiring electrodes 22a and 23a can be formed, for example, by a liftoff process.

Figure 7B:
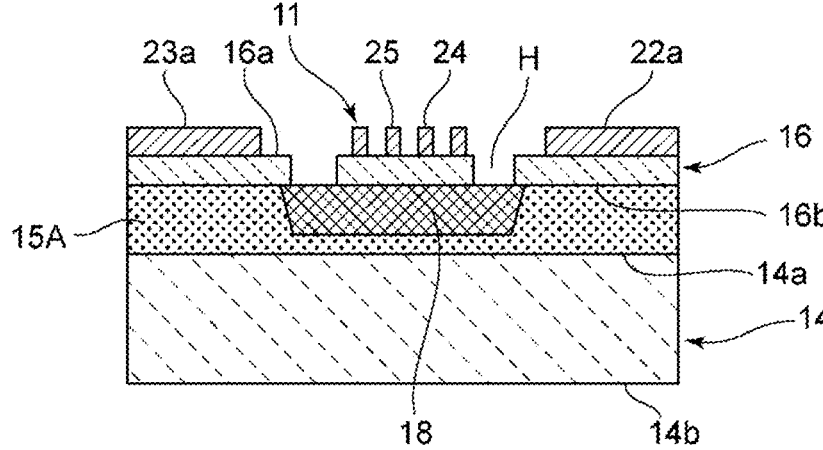

Next, as illustrated in FIG. 7B, the cavity H is formed. The cavity H can be formed by, for example, application of a resist, patterning, dry etching of the piezoelectric layer 16 in the cavity H, and removal of the resist.

Figure 7C:
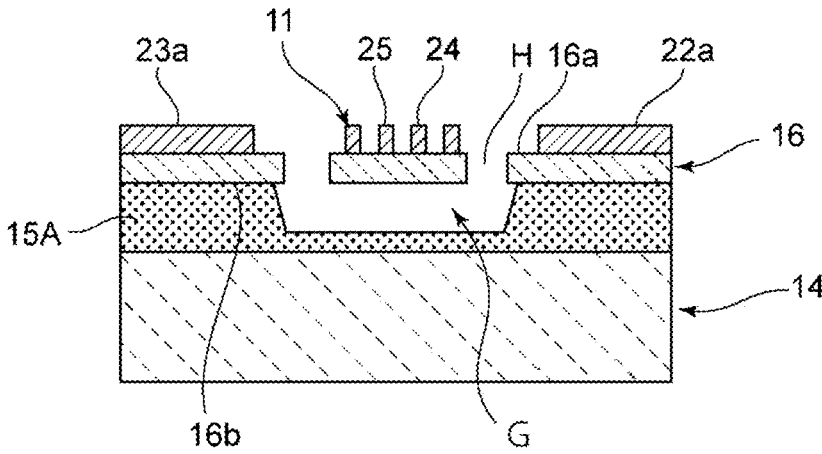

Next, as illustrated in FIG. 7C, the sacrificial layer 18 is removed. The sacrificial layer 18 can be removed by, for example, application of a resist, patterning, and removal of the sacrificial layer by injection of an etching liquid for removing the sacrificial layer through the cavity H, and removal of the resist.

Then, the high thermal conductive film 17 only needs be formed, as illustrated in FIGS. 5A and 5B.

A method for producing an acoustic wave device according to the present invention is not limited to the above examples.

Figure 8:
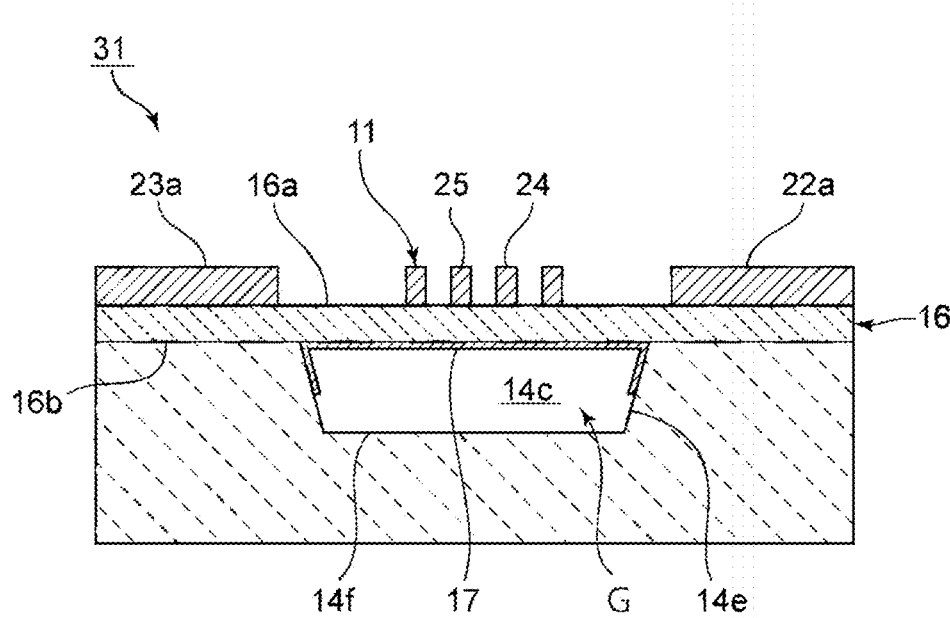
FIG. 8 is an elevational cross-sectional view of an acoustic wave device according to a second preferred embodiment of the present invention.

FIG. 8 is an elevational cross-sectional view of an acoustic wave device according to a second preferred embodiment of the present invention. In an acoustic wave device 31, a high thermal conductive film 17 is provided so as to extend from a second main surface 16b of a piezoelectric layer 16 to an intermediate point of an inner side wall 14e of a support substrate 14 defining and functioning as a support member. That is, the high thermal conductive film 17 is provided so as not to extend to a bottom surface 14f of a recessed portion 14c of the support substrate 14. As described above, the high thermal conductive film 17 only needs to include a portion that is directly or indirectly laminated on the second main surface 16b of the piezoelectric layer 16 and a portion that is provided on at least a portion of the inner side wall 14e of the support substrate 14 continuous with the second main surface 16b. This can effectively increase heat radiation performance.

Figure 9:
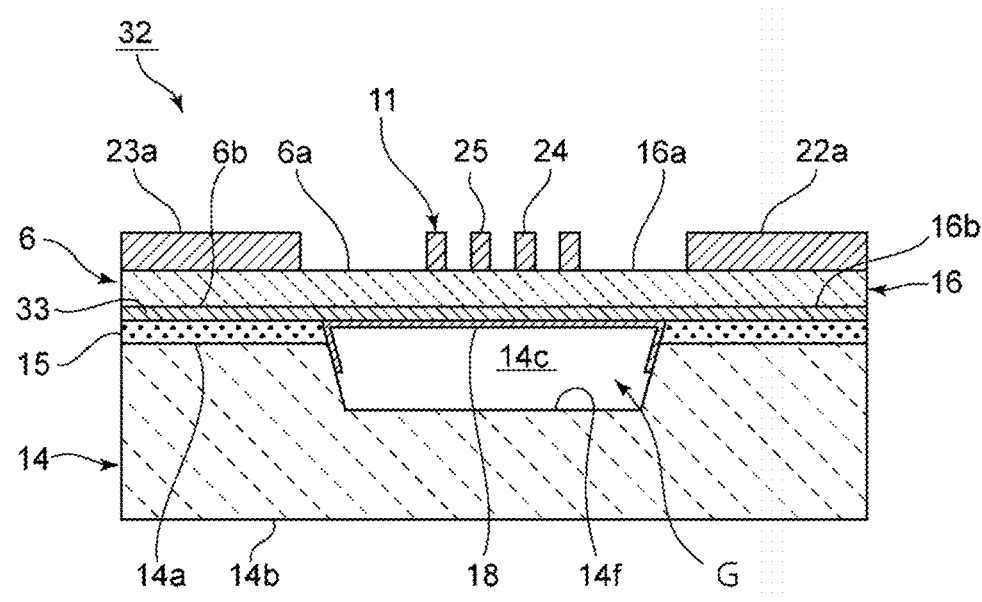
FIG. 9 is an elevational cross-sectional view of an acoustic wave device according to a third preferred embodiment of the present invention.

FIG. 9 is an elevational cross-sectional view of an acoustic wave device according to a third preferred embodiment of the present invention. In an acoustic wave device 32, an additional film 33 is provided. Furthermore, a dielectric layer 15 is provided. Except for this, the acoustic wave device 32 is the same as or similar to the acoustic wave device 31. The additional film 33 is laminated on an entire or substantially an entire second main surface 16b of a piezoelectric layer 16. The piezoelectric layer 16 is laminated on a support substrate 14 with the dielectric layer 15 and the additional film 33 interposed therebetween.

The high thermal conductive film 17 is not directly laminated on the second main surface 16b that is opposed to an IDT electrode 11. That is, the high thermal conductive film 17 is laminated on a portion of the second main surface 16b that faces the air gap portion G with the additional film 33 interposed therebetween.

Even in a case where the additional film 33 is provided, heat radiation performance can be increased due to the high thermal conductive film 17. That is, thermal conductivity of the additional film 33 may be lower than thermal conductivity of the support member. As the additional film 33, preferably, a film made of a material having higher thermal conductivity than the piezoelectric layer 16 is used.

However, that in a case where the additional film 33 has a small thickness, the thermal conductivity of the additional film 33 may be lower than the thermal conductivity of the piezoelectric layer 16. Even in this case, since the high thermal conductive film 17 is present on a lower surface of the additional film 33, heat radiation performance can be increased. As described above, the high thermal conductive film 17 may be indirectly laminated on the second main surface 16b of the piezoelectric layer 16.

Figure 10:
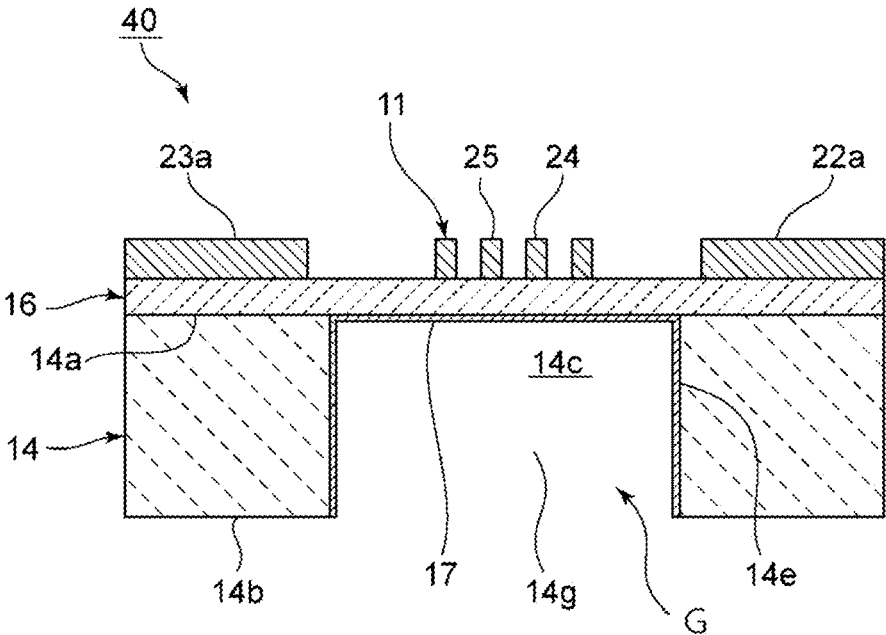
FIG. 10 is an elevational cross-sectional view of an acoustic wave device according to a fourth preferred embodiment of the present invention.

FIG. 10 is an elevational cross-sectional view of an acoustic wave device according to a fourth preferred embodiment of the present invention. In an acoustic wave device 40, a piezoelectric layer 16 is directly laminated on a support substrate 14. Furthermore, the support member includes only the support substrate 14. An air gap portion G facing a second main surface of the piezoelectric layer 16 is defined by a through-hole 14g provided in the support substrate 14. In this way, the through-hole 14g that passes through the support substrate 14 from a first main surface 14a to a second main surface 14b may be provided, and the air gap portion G may be thus provided.

In the acoustic wave device 40, a high thermal conductive film 17 is provided so as to extend from a second main surface 16b of the piezoelectric layer 16 to an inner side wall 14e of the support substrate 14. In this way, heat radiation performance is increased.

Figure 11:
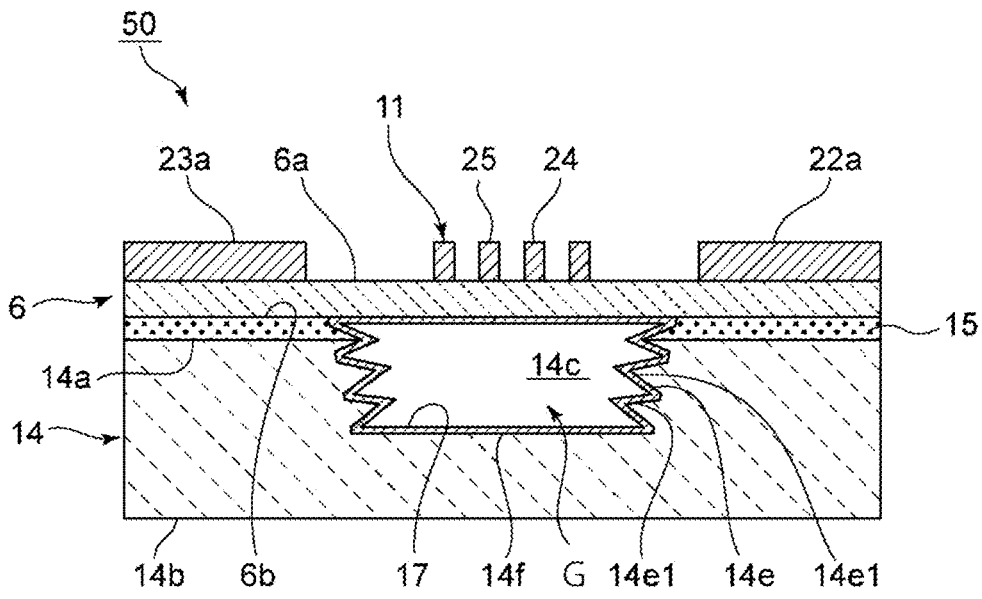
FIG. 11 is an elevational cross-sectional view of an acoustic wave device according to a fifth preferred embodiment of the present invention.

FIG. 11 is an elevational cross-sectional view of an acoustic wave device according to a fifth preferred embodiment of the present invention. In an acoustic wave device 50, an inner side wall 14e of a support substrate 14 that faces an air gap portion G includes a protruding portion 14e1. A high thermal conductive film 17 further extends to a bottom surface 14f so as to cover an uneven portion of the inner side wall 14e. As described above, the protruding portion 14e1 may be provided on at least a portion of the inner side wall 14e of the support substrate 14. In this case, a surface area of the high thermal conductive film 17 increases. It is therefore possible to further increase heat radiation performance.

Figure 12:
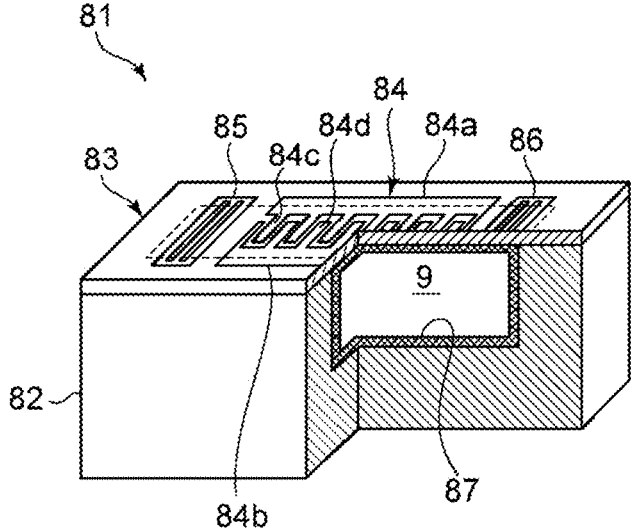
FIG. 12 is a partially cut-away perspective view of an acoustic wave device according to a sixth preferred embodiment of the present invention.

FIG. 12 is a partially cut-away perspective view for explaining an acoustic wave device according to a sixth preferred embodiment of the present invention.

An acoustic wave device 81 includes a support substrate 82. The support substrate 82 includes a recessed portion opened on an upper surface. A piezoelectric layer 83 is laminated on the support substrate 82. In this way, an air gap portion 9 is provided. An IDT electrode 84 is provided on the piezoelectric layer 83 so as to be located above the air gap portion 9. Reflectors 85 and 86 are provided on both sides of the IDT electrode 84 in an acoustic wave propagation direction, respectively. In FIG. 12, an outer peripheral edge of the air gap portion 9 is indicated by the broken line. The IDT electrode 84 includes first and second busbars 84a and 84b, and electrodes 84c as a plurality of first electrode fingers and electrodes 84d as a plurality of second electrode fingers. The plurality of electrodes 84c are connected to the first busbar 84a. The plurality of electrodes 84d are connected to the second busbar 84b. The plurality of electrodes 84c and the plurality of electrodes 84d interdigitate with each other.

In the air gap portion 9, a high thermal conductive film 87 is provided so as to extend from a lower side of the piezoelectric layer 83 to an inner side wall of the recessed portion.

In the acoustic wave device 81, a Lamb wave as a plate wave is excited by applying an alternating-current electric field to the IDT electrode 84 above the air gap portion 9. Since the reflectors 85 and 86 are provided on both sides, resonance characteristics can be obtained. As described above, an acoustic wave device according to a preferred embodiment of the present invention may use a plate wave.

An acoustic wave device that uses a bulk wave in a thickness shear mode which an acoustic wave device according to a preferred embodiment of the present invention is suitably used as is described. A support member in the following example corresponds to a support substrate according to a preferred embodiment of the present invention.

Figure 13A:
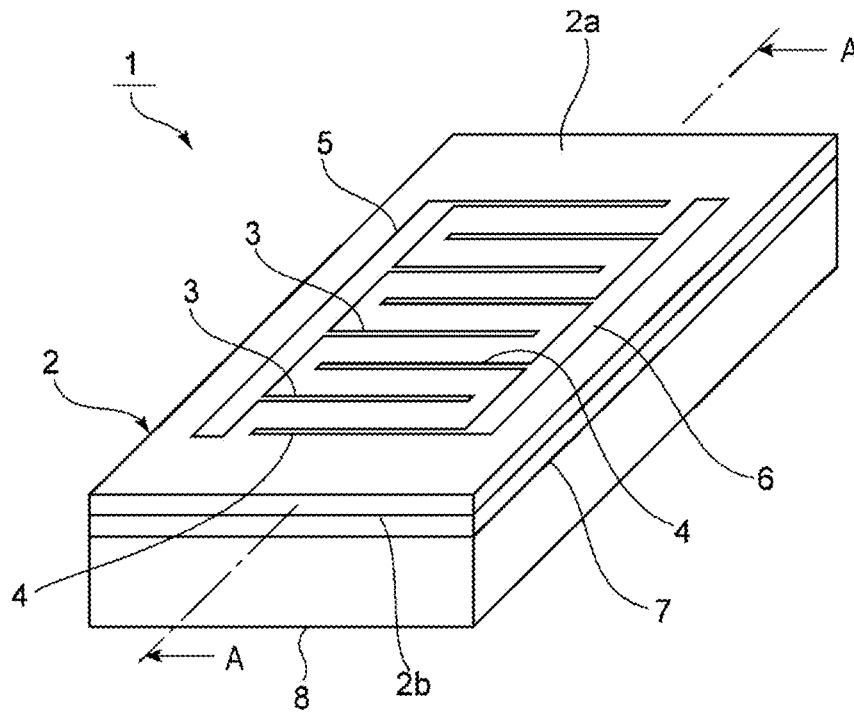
FIGS. 13A and 13B are a schematic perspective view illustrating an external appearance of an acoustic wave device that uses a thickness shear mode and a plan view illustrating an electrode structure on a piezoelectric layer.
Figure 13B:
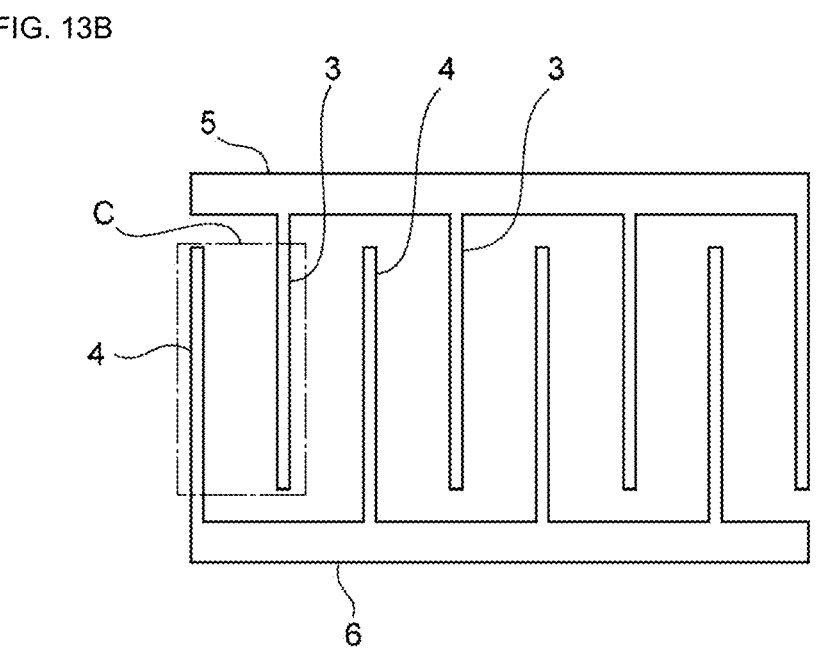
Figures 14, 15A, 15B:
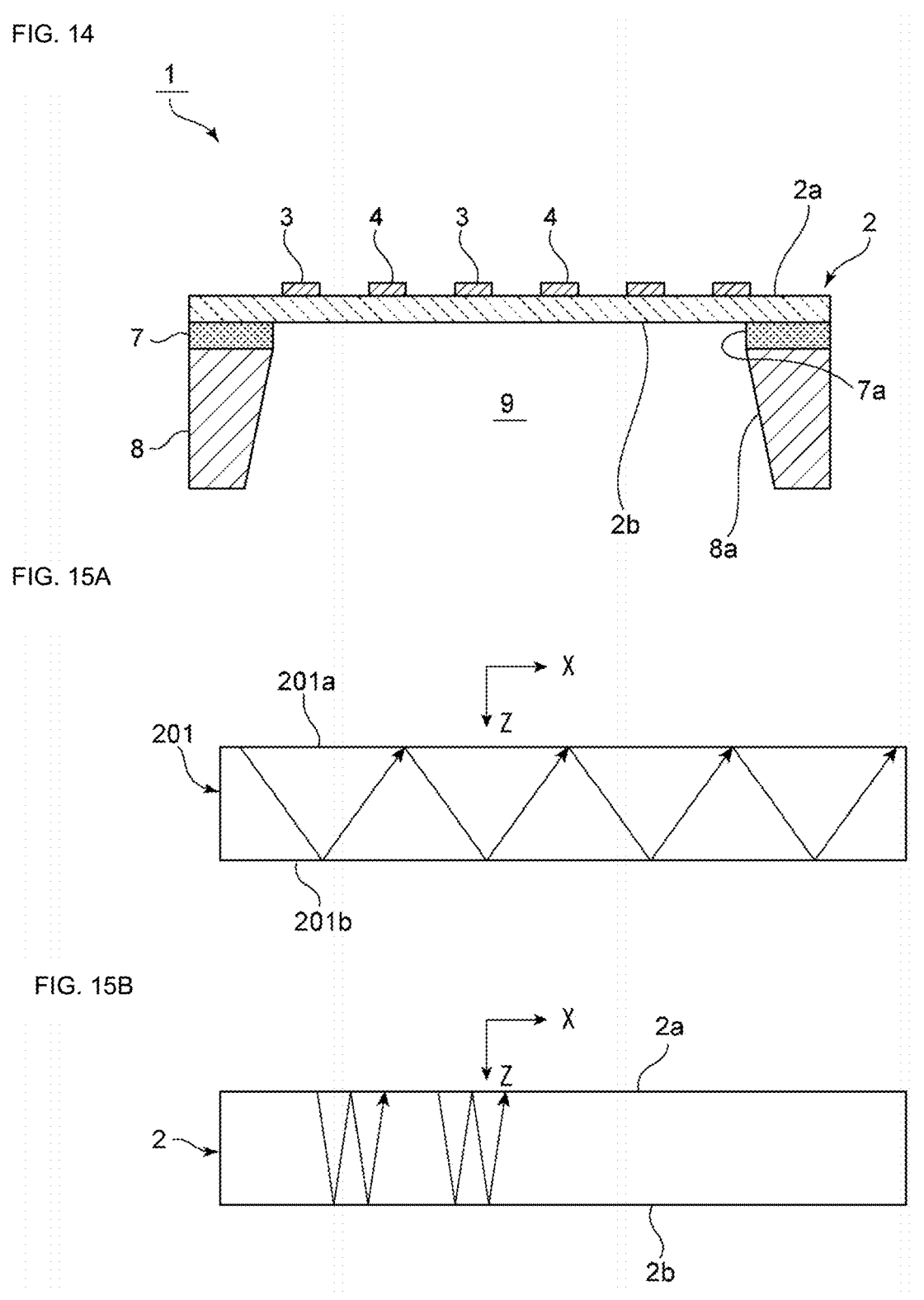

FIG. 13A is a schematic perspective view illustrating external appearance of an acoustic wave device that uses a bulk wave in a thickness shear mode, FIG. 13B is a plan view illustrating an electrode structure on a piezoelectric layer, and FIG. 14 is a cross-sectional view taken along line A-A of FIG. 13A.

An acoustic wave device 1 includes a piezoelectric layer 2 made of, for example, LiNbO$_3$. The piezoelectric layer 2 may be made of, for example, LiTaO$_3$. Cut-angles of LiNbO$_3$ or LiTaO$_3$ are Z-cut but may be rotated Y-cut or X-cut. A thickness of the piezoelectric layer 2 is not limited in particular, but is preferably, for example, about 40 nm or more and about 1000 nm or less, and more preferably about 50 nm or more and about 1000 nm or less to effectively excite the thickness shear mode. The piezoelectric layer 2 includes first and second main surfaces 2a and 2b that are opposed to each other. Electrode fingers 3 and electrode fingers 4 are provided on the first main surface 2a. In FIGS. 13A and 13B, the plurality of electrode fingers 3 are connected to a first busbar 5. The plurality of electrode fingers 4 are connected to a second busbar 6. The plurality of electrode fingers 3 and the plurality of electrode fingers 4 are interdigitated with each other. The electrode fingers 3 and the electrode fingers 4 have a rectangular or substantially rectangular shape and have a length direction. Each of the electrode fingers 3 faces an adjacent electrode finger 4 in a direction orthogonal or substantially orthogonal to the length direction. The length direction of the electrode fingers 3 and 4 and the direction orthogonal or substantially orthogonal to the length direction of the electrode fingers 3 and 4 are directions that cross a thickness direction of the piezoelectric layer 2. It can therefore be said that each of the electrode fingers 3 faces an adjacent electrode finger 4 in a direction that crosses the thickness direction of the piezoelectric layer 2. The length direction of the electrode fingers 3 and 4 may be exchanged with the direction orthogonal or substantially orthogonal to the length direction of the electrode fingers 3 and 4 illustrated in FIGS. 13A and 13B. That is, in FIGS. 13A and 13B, the electrode fingers 3 and 4 may extend in a direction in which the first busbar 5 and the second busbar 6 extend. In this case, the first busbar 5 and the second busbar 6 extend in a direction in which the electrode fingers 3 and 4 extend in FIGS. 13A and 13B. Plural pairs of electrode finger 3 connected to one potential and electrode finger 4 connected to the other potential that are adjacent to each other are provided in the direction orthogonal or substantially orthogonal to the length direction of the electrode fingers 3 and 4. The state where the electrode finger 3 and the electrode finger 4 are adjacent to each other is a not a case where the electrode finger 3 and the electrode finger 4 are disposed in direct contact with each other, but a case where the electrode finger 3 and the electrode finger 4 are disposed apart from each other. In a case where the electrode finger 3 and the electrode finger 4 are adjacent to each other, an electrode connected to a hot electrode or a ground electrode, examples of which include another electrode finger 3 or 4, is not disposed between the electrode finger 3 and the electrode finger 4. The number of pairs need not be an integer, and may be, for example, 1.5 or 2.5. A center-to-center distance between the electrode fingers 3 and 4, that is, a pitch is preferably, for example, in a range of about 1 μm or more and about 10 μm or less. A width of the electrode fingers 3 and 4, that is, a dimension of the electrode fingers 3 and 4 in a direction in which the electrode fingers 3 and 4 face each other is preferably, for example, in a range of about 50 nm or more and about 1000 nm or less, and more preferably in a range of about 150 nm or more and about 1000 nm or less. The center-to-center distance between the electrode fingers 3 and 4 is a distance between a center of a dimension (width dimension) of the electrode finger 3 in the direction orthogonal or substantially orthogonal to the length direction of the electrode finger 3 and a center of a dimension (width dimension) of the electrode finger 4 in the direction orthogonal to the length direction of the electrode finger 4.

Since a Z-cut piezoelectric layer is used in the acoustic wave device 1, the direction orthogonal or substantially orthogonal to the length direction of the electrode fingers 3 and 4 is a direction orthogonal or substantially orthogonal to a polarization direction of the piezoelectric layer 2. This is not the case in a case where a piezoelectric body having different cut-angles is used as the piezoelectric layer 2. The term "orthogonal" as used herein is not limited to "strictly orthogonal", but may be "substantially orthogonal" (an angle between the direction orthogonal to the length direction of the electrode fingers 3 and 4 and the polarization direction is, for example, within a range of about 90°±10°.

A support member 8 is laminated on a second main surface 2b side of the piezoelectric layer 2 with an insulating layer 7 interposed therebetween. The insulating layer 7 and the support member 8 have a frame shape, and include cavities 7a and 8a, respectively, as illustrated in FIG. 14. Thus, an air gap portion 9 is provided so that vibration of an excitation region C of the piezoelectric layer 2 is not hindered. Accordingly, the support member 8 is laminated on the second main surface 2b with the insulating layer 7 interposed therebetween at a position that does not overlap a portion where at least one pair of electrode fingers 3 and 4 are provided. The insulating layer 7 need not necessarily be provided. Therefore, the support member 8 can be directly or indirectly provided on the second main surface 2b of the piezoelectric layer 2.

The insulating layer 7 is made of, for example, silicon oxide. However, that the insulating layer 7 may be made of an appropriate insulating material such as, for example, silicon oxynitride or alumina instead of silicon oxide. The support member 8 is made of, for example, Si. A plane orientation of Si on a surface on the piezoelectric layer 2 side may be (100) or (110) or may be (111). Si of the support member 8 preferably has high resistivity about 4 kΩ or more, for example. However, the support member 8 can also be made of an appropriate insulating material or semiconductor material.

Examples of a material of the support member 8 include piezoelectric bodies such as aluminum oxide, lithium tantalate, lithium niobate, and crystal, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The plurality of electrode fingers 3 and 4 and the first and second busbars 5 and 6 are made of an appropriate metal or alloy such as, for example, Al or an AlCu alloy. In the present preferred embodiment, the electrode fingers 3 and 4 and the first and second busbars 5 and 6 have a structure including an Al film laminated on a Ti film. A close contact layer other than a Ti film may be used.

For driving, an alternating-current voltage is applied between the plurality of electrode fingers 3 and the plurality of electrode fingers 4. More specifically, an alternating-current voltage is applied between the first busbar 5 and the second busbar 6. This makes it possible to obtain resonance characteristics using a bulk wave in a thickness shear mode excited in the piezoelectric layer 2. In the acoustic wave device 1, d/p is, for example, about 0.5 or less where d is a thickness of the piezoelectric layer 2 and p is a center-to-center distance between adjacent electrode fingers 3 and 4 in any of the pairs of electrode fingers 3 and 4. Therefore, the bulk wave in the thickness shear mode is effectively excited, and good resonance characteristics can be obtained. More preferably, d/p is, for example, about 0.24 or less. In this case, still better resonance characteristics can be obtained.

In the acoustic wave device 1 configured as above, a Q factor is less likely to decrease even in a case where the number of pairs of electrode fingers 3 and 4 is decreased to achieve a reduction in size. This is because a propagation loss is small even in a case where the number of electrode fingers in reflectors on both sides is decreased. The decrease in the number of electrode fingers can be achieved because the bulk wave in the thickness shear mode is used. A difference between a Lamb wave used in an acoustic wave device and the bulk wave in the thickness shear mode is described with reference to FIGS. 15A and 15B.

FIG. 15A is a schematic elevational cross-sectional view for explaining a Lamb wave propagating through a piezoelectric film of an acoustic wave device such as the one described in U.S. Pat. No. 10,491,192. The wave propagates through a piezoelectric film 201 as indicated by the arrows. A first main surface 201a and a second main surface 201b of the piezoelectric film 201 are opposed to each other, and a thickness direction connecting the first main surface 201a and the second main surface 201b is a Z direction. An X direction is a direction in which electrode fingers of an IDT electrode are arranged. As illustrated in FIG. 15A, the Lamb wave propagates in the X direction. Since the Lamb wave is a plate wave, the piezoelectric film 201 vibrates as a whole, but since the wave propagates in the X direction, resonance characteristics are obtained by disposing a reflector on both sides. Therefore, a propagation loss of the wave occurs, and in a case where a size is reduced, that is, in a case where the number of pairs of electrode fingers is reduced, a Q factor decreases.

On the other hand, as illustrated in FIG. 15B, in the acoustic wave device 1, vibration displacement occurs in a thickness shear direction, and therefore the wave primarily propagates and resonates in a direction connecting the first main surface 2a and the second main surface 2b of the piezoelectric layer 2, that is, in the Z direction. That is, an X direction component of the wave is much smaller than a Z direction component. Since resonance characteristics are obtained by propagation of the wave in the Z direction, a propagation loss is unlikely to occur even in a case where the number of electrode fingers of the reflector is reduced. Furthermore, even in a case where the number of electrode finger pairs of electrode fingers 3 and 4 is decreased to achieve a reduction in size, a decrease in Q factor is less likely to occur.

Figure 16:
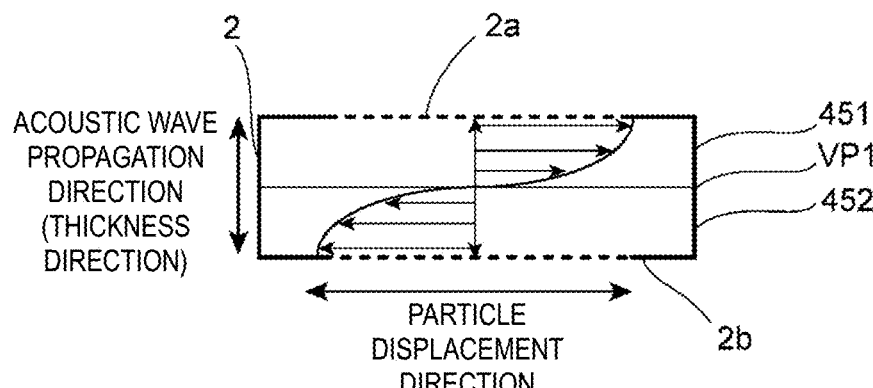
FIG. 16 is a view for explaining an amplitude direction of a bulk wave in a thickness shear mode.

An amplitude direction of the bulk wave in the thickness shear mode in a first region 451 included in the excitation region C of the piezoelectric layer 2 and an amplitude direction of the bulk wave in the thickness shear mode in a second region 452 included in the excitation region C are reversed, as illustrated in FIG. 16. FIG. 16 schematically illustrates a bulk wave a voltage is applied between the electrode finger 3 and the electrode finger 4 so that a potential of the electrode finger 4 becomes higher than a potential of the electrode finger 3. The first region 451 is a region of the excitation region C between a virtual plane VP1 that is orthogonal or substantially orthogonal to the thickness direction of the piezoelectric layer 2 and divides the piezoelectric layer 2 into two portions and the first main surface 2a. The second region 452 is a region of the excitation region C between the virtual plane VP1 and the second main surface 2b.

Although at least one electrode pair of electrode fingers 3 and 4 is disposed in the acoustic wave device 1 as described above, the number of electrode fingers pairs of electrode fingers 3 and 4 need not necessarily be plural since the wave is not propagated in the X direction. That is, it is only necessary that at least one electrode pair is provided.

For example, the electrode finger 3 is an electrode connected to a hot potential, and the electrode finger 4 is an electrode connected to a ground potential. However, the electrode finger 3 may be connected to the ground potential, and the electrode finger 4 may be connected to the hot potential. In the present preferred embodiment, the at least one electrode pair is an electrode connected to the hot electrode or an electrode connected to the ground electrode as described above, and no floating electrode is provided.

Figure 17:
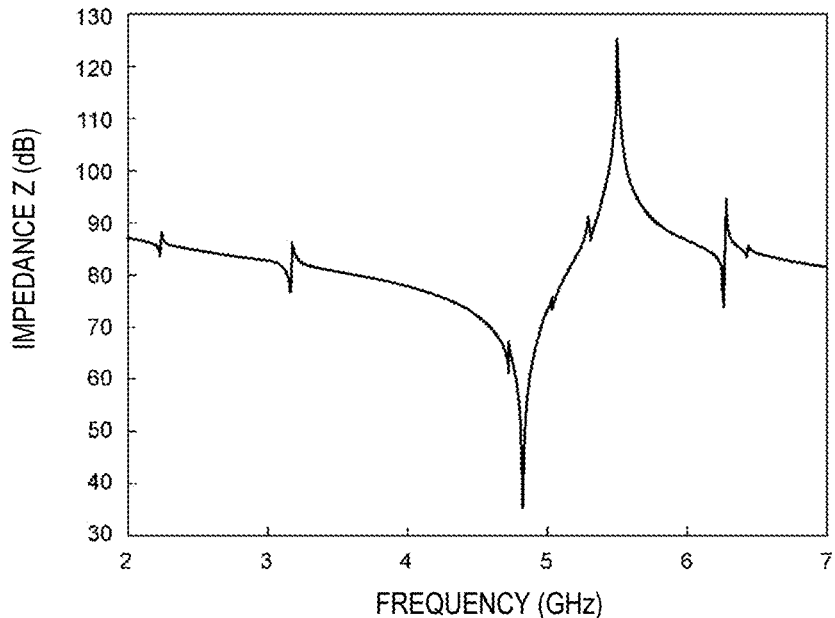
FIG. 17 illustrates resonance characteristics of the acoustic wave device that uses the thickness shear mode.

FIG. 17 illustrates resonance characteristics of the acoustic wave device illustrated in FIG. 14. Design parameters of the acoustic wave device 1 for which the above resonance characteristics were obtained are as follows.

piezoelectric layer 2: LiNbO₃ of Euler angles (about 0°, about 0°, about 90°), thickness=about 400 nm.

a length of a region where the electrode finger 3 and the electrode finger 4 overlap each other when viewed in a direction orthogonal or substantially orthogonal to the length direction of the electrode finger 3 and the electrode finger 4, that is, the excitation region C=about 40 μm, the number of electrode finger pairs of electrode fingers 3 and 4=21 pairs, a center-to-center distance between the electrode fingers=about 3 μm, a width of the electrode fingers 3 and 4=about 500 nm, d/p=about 0.133.

insulating layer 7: silicon oxide film having a thickness of about 1 μm.

support member 8: Si.

The length of the excitation region C is a dimension of the excitation region C along the length direction of the electrode fingers 3 and 4.

In the present preferred embodiment, the distances between electrode fingers in all of the electrode finger pairs of electrode fingers 3 and 4 were set to be equal or substantially equal. That is, the electrode fingers 3 and the electrode fingers 4 were disposed at an equal or substantially equal pitch.

As is clear from FIG. 17, good resonance characteristics in which a fractional bandwidth is about 12.5% are obtained although no reflector is provided.

In the present preferred embodiment, d/p is about 0.5 or less, and more preferably about 0.24 or less as described above where d is a thickness of the piezoelectric layer 2 and p is a center-to-center distance between the electrode finger 3 and the electrode finger 4. This is described with reference to FIG. 18.

Figure 18:
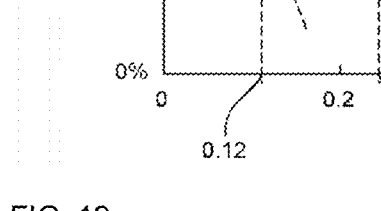
FIG. 18 illustrates a relationship between d/2p where p is a center-to-center distance between adjacent electrode fingers and d is a thickness of a piezoelectric layer, and a fractional bandwidth as a resonator.

A plurality of acoustic wave devices the same as or similar to the acoustic wave device for which the resonance characteristics illustrated in FIG. 17 were obtained were obtained by changing d/2p. FIG. 18 illustrates a relationship between d/2p and a fractional bandwidth as a resonator of the acoustic wave device.

As is clear from FIG. 18, in a case where d/2p is larger than about 0.25, that is, in a case where d/p is larger than about 0.5, the fractional bandwidth is less than about 5% even in a case where d/p is adjusted. On the other hand, in a case where d/2p is equal to or smaller than about 0.25, that is, d/p is equal to or smaller than about 0.5, the fractional bandwidth can be made equal to or higher than about 5%, that is, a resonator having a high coupling coefficient can be obtained by changing d/p within this range. Furthermore, in a case where d/2p is equal to or smaller than about 0.12, that is, d/p is equal to or smaller than about 0.24, the fractional bandwidth can be increased to about 7% or higher. In addition, by adjusting d/p within this range, a resonator having a wider fractional bandwidth can be obtained, and a resonator having a still higher coupling coefficient can be realized. This shows that a resonator having a high coupling coefficient that uses the bulk wave in the thickness shear mode can be obtained by setting d/p equal to or less than about 0.5.

Figure 19:
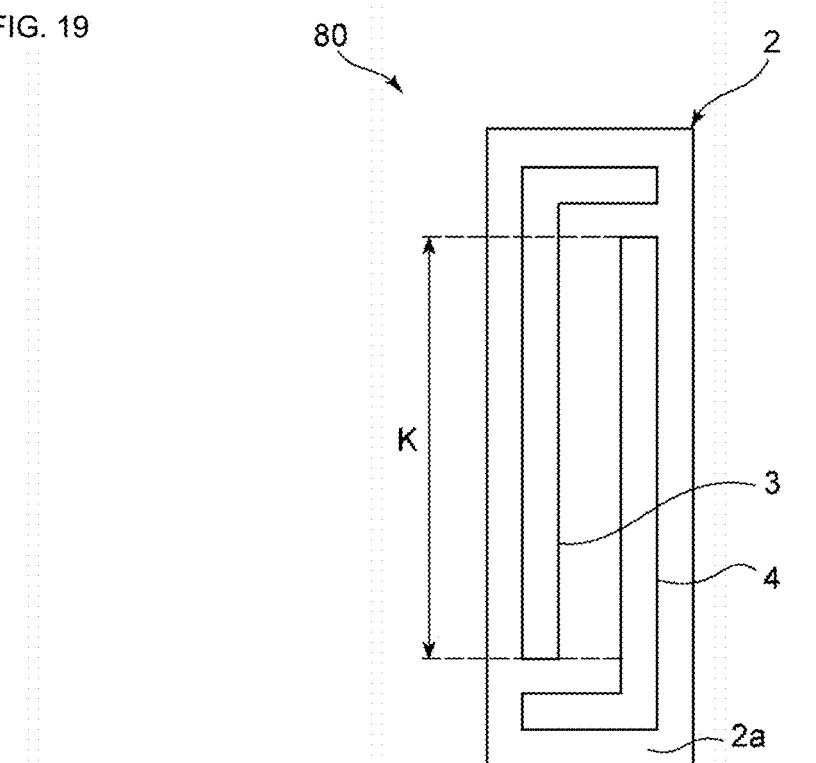
FIG. 19 is a plan view illustrating an acoustic wave device that uses a bulk wave in a thickness shear mode.

FIG. 19 is a plan view of an acoustic wave device that uses a bulk wave in a thickness shear mode. In an acoustic wave device 80, one electrode pair having an electrode finger 3 and an electrode finger 4 is provided on a first main surface 2a of a piezoelectric layer 2. Note that K in FIG. 19 is a cross width. As described above, the number of pairs of electrode fingers may be one. Even in this case, the bulk wave in the thickness shear mode can be effectively excited as long as d/p is about 0.5 or less.

Figure 20:
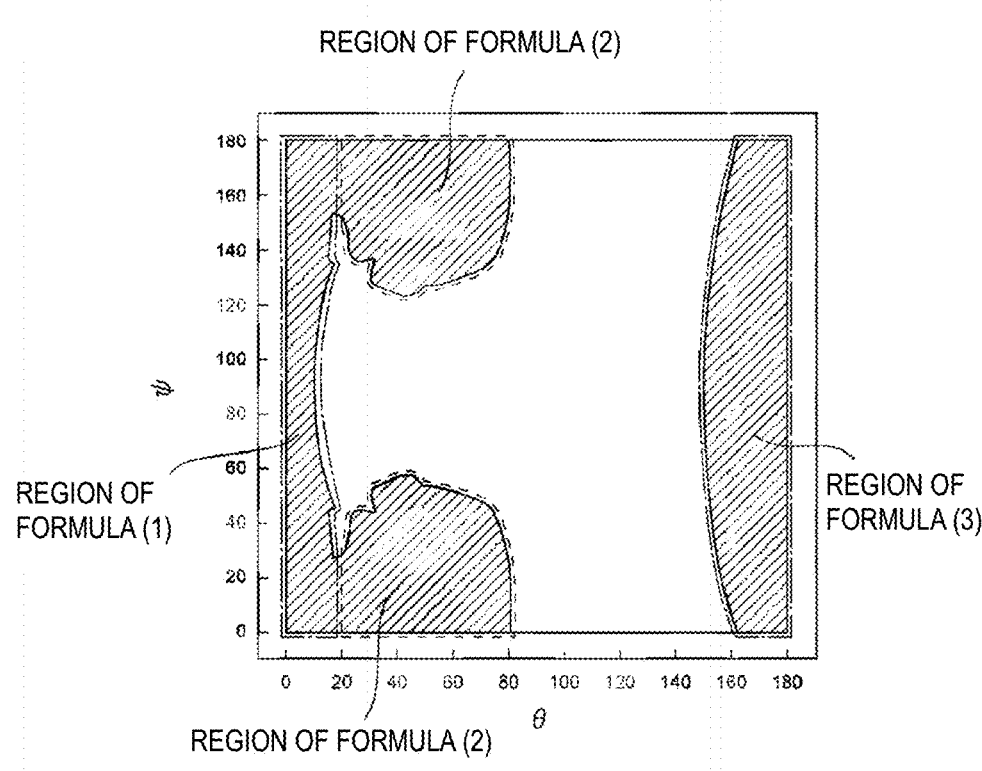
FIG. 20 illustrates a map of a fractional bandwidth with respect to Euler angles $(0°, \theta, \psi)$ of $LiNbO_3$ in a case where d/p is made as close to 0 as possible.

FIG. 20 illustrates a map of a fractional bandwidth with respect to Euler angles (0°, θ, ψ) of LiNbO₃ in a case where d/p is made as close to 0 as possible. The portions with hatching in FIG. 20 are regions where a fractional bandwidth of about 5% or more is obtained, and ranges of the regions are approximated to ranges expressed by the following formulas (1), (2), and (3).

$$(0°±10°,0° \text{ to } 20°, \text{any } \psi) \qquad \text{formula (1)}$$

$$(0°±10°,20° \text{ to } 80°,0° \text{ to } 60°(1-(\theta-50)2/900)1/2) \text{ or} \\ (0°±10°,20° \text{ to } 80°,[180°-60°(1-(\theta-50)2/900)1/ \\ 2]\text{to } 180°) \qquad \text{formula (2)}$$

$$(0°±10°,[180°-30°(1-(\psi-90)2/8100)1/2]\text{to } 180°, \text{any} \\ \psi) \qquad \text{formula (3)}$$

Therefore, the Euler angle range of the formula (1), (2), or (3) allows the fractional bandwidth to be sufficiently wide and is therefore preferable. The same applies to a case where the piezoelectric layer 2 is, for example, a lithium tantalate layer.

Figure 21:
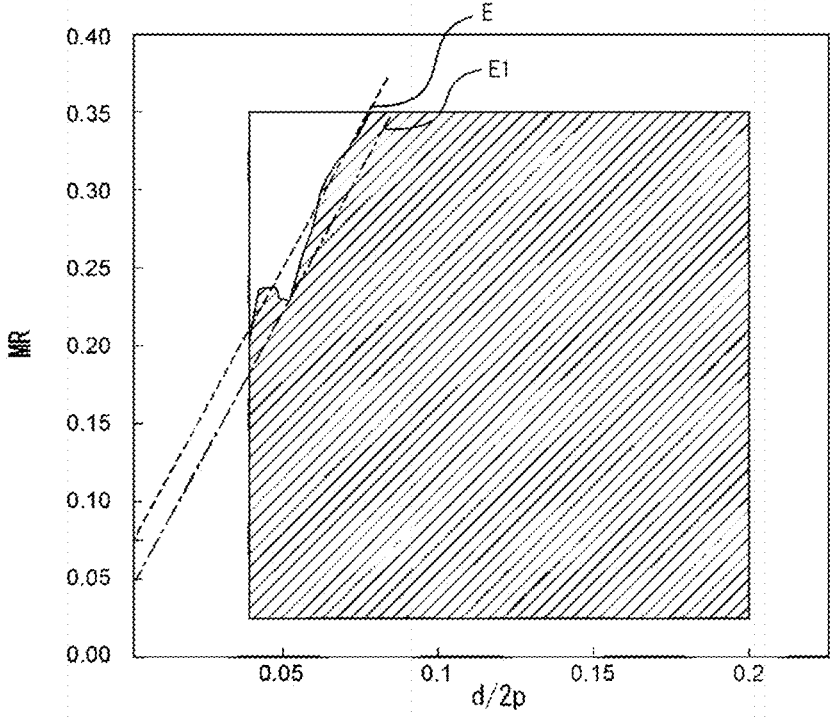
FIG. 21 illustrates a relationship among d/2p, a metallization ratio MR, and a fractional bandwidth.

FIG. 21 illustrates a relationship among d/2p, a metallization ratio, and a fractional bandwidth. Based on the acoustic wave device above, various acoustic wave devices that are different in d/2p and MR were obtained, and fractional bandwidths were measured. The part with hatching on the right side of the broken line E of FIG. 21 is a region where the fractional bandwidth is about 17% or less. In a case where the fractional bandwidth is about 17% or less, spurious emissions can be suitably reduced or prevented by adjusting a film thickness of the piezoelectric layer 2, dimensions of the electrode fingers 3 and 4, and the like. A boundary between the region with hatching and a region without hatching is expressed by MR=about 3.5 (d/2p)+0.075. That is, MR=about 1.75 (d/p)+0.075. Accordingly, preferably, MR≥about 1.75 (d/p)+0.075. In this case, it is easy to make the fractional bandwidth equal to or less than about 17%. A region on the right side of MR=about 3.5 (d/2p)+0.05 indicated by the line E1 with alternate long and short dashes in FIG. 21 is more preferable. That is, the fractional bandwidth can be made equal to or less than about 17% with certainty in a case where MR≥about 1.75 (d/p)+0.05.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support including a support substrate;
a piezoelectric layer on the support and including first and second main surfaces opposed to each other; and
an IDT electrode on the first main surface of the piezoelectric layer and including a plurality of electrode fingers; wherein
the support includes an air gap portion open on a piezoelectric layer side, and the air gap portion overlaps at least a portion of the IDT electrode in a thickness direction of the support;
the support includes an inner side wall facing the air gap portion; and
a high thermal conductive film is provided that is directly or indirectly laminated on at least a portion of the second main surface of the piezoelectric layer, extends to the inner side wall of the support, and has higher thermal conductivity than the piezoelectric layer.

2. The acoustic wave device according to claim 1, wherein the support includes the support substrate and a dielectric layer between the support substrate and the piezoelectric layer.

3. The acoustic wave device according to claim 2, wherein thermal conductivity of at least one of the support substrate and the dielectric layer is higher than thermal conductivity of the piezoelectric layer.

4. The acoustic wave device according to claim 1, wherein the support includes only the support substrate.

5. The acoustic wave device according to claim 4, wherein thermal conductivity of the support substrate is higher than thermal conductivity of the piezoelectric layer.

6. The acoustic wave device according to claim 1, further comprising:
an additional film on the second main surface of the piezoelectric layer and located between the second main surface of the piezoelectric layer and the high thermal conductive film; wherein
the additional film is made of a material having lower thermal conductivity than the support.

7. The acoustic wave device according to claim 1, wherein the inner side wall includes an uneven portion.

8. The acoustic wave device according to claim 1, wherein the support includes a bottom surface facing the piezoelectric layer in the air gap portion.

9. The acoustic wave device according to claim 8, wherein the high thermal conductive film extends to the bottom surface located in the air gap portion of the support.

10. The acoustic wave device according to claim 1, wherein the air gap portion includes a through-hole that passes through the support.

11. The acoustic wave device according to claim 1, wherein the high thermal conductive film is a dielectric film.

12. The acoustic wave device according to claim 1, wherein the high thermal conductive film is an atomic layer deposition film.

13. The acoustic wave device according to claim 12, wherein the high thermal conductive film is made of one of aluminum oxide, silicon oxide, silicon nitride, or silicon oxynitride.

14. The acoustic wave device according to claim 1, wherein the acoustic wave device is operable to generate a plate wave.

15. The acoustic wave device according to claim 1, wherein the acoustic wave device is operable to generate a bulk wave in a thickness shear mode.

16. The acoustic wave device according to claim 15, wherein d/p is about 0.5 or less, where d is a thickness of the piezoelectric layer and p is a center-to-center distance between adjacent ones of the electrode fingers.

17. The acoustic wave device according to claim 16, wherein d/p is about 0.24 or less.

18. The acoustic wave device according to claim 16, wherein
a region where adjacent ones of the electrode fingers overlap each other when viewed in a direction in which the adjacent ones of the electrode fingers face each other is an excitation region; and
MR≥about 1.75 (d/p)+0.075 is satisfied, where MR is a metallization ratio of the plurality of electrode fingers with respect to the excitation region.

19. The acoustic wave device according to claim 1, wherein the piezoelectric layer is a lithium tantalate layer or a lithium niobate layer.

20. The acoustic wave device according to claim 1, wherein

Euler angles ($\varphi$, $\theta$, $\psi$) of the lithium niobate or lithium tantalate are within a range of the following formula (1), (2), or (3):

$$(0°±10°,0° \text{ to } 20°, \text{any } \psi) \qquad \text{formula (1)}$$

$$(0°±10°,20° \text{ to } 80°,0° \text{ to } 60°(1-(\theta-50)^2/900)^{1/2}) \text{ or}$$
$$(0°±10°,20° \text{ to } 80°,[180°-60°(1-(\theta-50)^2/900)^{1/2}]\text{to } 180°) \qquad \text{formula (2)}$$

$$(0°±10°,[180°-30°(1-(\psi-90)^2/8100)^{1/2}]\text{to } 180°, \text{any } \psi) \qquad \text{formula (3)}.$$

21. A method for producing an acoustic wave device, the method comprising:

preparing a structure including a support including a support substrate, a piezoelectric layer on the support and including first and second main surfaces opposed to each other, and an IDT electrode on the first main surface of the piezoelectric layer and including a plurality of electrode fingers, the support including an air gap portion opened on a piezoelectric layer side, the air gap portion overlapping at least a portion of the IDT electrode in a thickness direction of the support, and the support including an inner side wall facing the air gap portion; and forming, in the air gap portion of the structure, a high thermal conductive film extending from the second main surface of the piezoelectric layer to the inner side wall of the support and being made of a material having higher thermal conductivity than the piezoelectric layer.

*  *  *  *  *